(12) United States Patent
Mattisson et al.

(10) Patent No.: US 6,577,212 B1
(45) Date of Patent: Jun. 10, 2003

(54) INTEGRATED CIRCUIT

(75) Inventors: Sven Mattisson, Bjärred (SE); Henrik Geis, Lund (SE)

(73) Assignee: Telefonaktiebolaget L M Ericsson (Publ), Stockholm (SE)

(*) Notice: Subject to any disclaimer, the term of this patent is extended or adjusted under 35 U.S.C. 154(b) by 0 days.

(21) Appl. No.: 09/617,109

(22) Filed: Jul. 14, 2000

(30) Foreign Application Priority Data

Jul. 16, 1999 (GB) .............................. 9916808

(51) Int. Cl.$^7$ .............................. H03H 11/42
(52) U.S. Cl. ...................... 333/215; 333/213
(58) Field of Search .............. 333/215, 216, 333/217, 213; 33/108 B, 57, 132, 135; 330/271

(56) References Cited

U.S. PATENT DOCUMENTS

| | | | | |
|---|---|---|---|---|
| 3,840,829 A | * | 10/1974 | Fletcher et al. | ............ 333/80 T |
| 4,565,962 A | * | 1/1986 | Nagano | ............ 323/351 |
| 5,117,205 A | * | 5/1992 | Nauta | ............ 331/117 FE |
| 5,371,475 A | * | 12/1994 | Brown | ............ 330/254 |

FOREIGN PATENT DOCUMENTS

| | | | | |
|---|---|---|---|---|
| GB | 1120592 | 7/1968 | ............ | H03H/11/00 |
| GB | 1277495 | 6/1972 | ............ | H03H/7/44 |
| GB | 1405232 | 9/1975 | ............ | H03H/7/44 |
| GB | 1531447 | 11/1978 | ............ | H03H/11/00 |
| GB | 2049332 A | 12/1980 | ............ | H03H/11/12 |
| GB | 2049333 A | 12/1980 | ............ | H03H/11/08 |
| GB | 2307124 A | 5/1997 | ............ | H03H/11/04 |
| WO | W90/12454 | 10/1990 | ............ | H03H/11/42 |

OTHER PUBLICATIONS

Jacob Millman, Microelectronics: Digital and Analog Circuits and Systems 1979, McGraw–Hill, pp. 397–399.*
International Search Report, Oct. 20, 2000, Telefonaktiebolaget L M Ericsson, PCT/EP00/06344.
British Search Report, Feb. 9, 2000, Telefonaktiebolaget L M Ericsson, GB9916808.0.
"Analog CMOS Filters for Very High Frequencies", The Kluwer International Series in Engineering and Computer Science, vol. 190; Bram Nauta, Philips Research Laboratories, Eindhoven, the Netherlands.
A CMOS Transconductance–C Filter Technique for Very High Frequencies; IEEE Journal of Solid–State Circuits, vol. 27, No. 12, Feb. 1992; Bram Nauta.
Active filters: part 10 Synthetic inductors from gyrators; Electronics, Jul. 7, 1969, Gerald Aaronson, General Telephone & Electronics Laboratories Inc., Bayside, NY.

* cited by examiner

*Primary Examiner*—Robert Pascal
*Assistant Examiner*—Dean Takaoka
(74) *Attorney, Agent, or Firm*—Burns, Doane, Swecker & Mathis, L.L.P.

(57) ABSTRACT

The invention relates to an integrated gyrator structure, in which each transistor in the gyrator core (preferably MOS devices) has series feedback associated therewith. This allows for compensation over a large bandwidth of the effects of channel delay in the MOS transistors.

8 Claims, 3 Drawing Sheets

INTEGRATED CIRCUIT

This application claims priority under 35 U.S.C. §§119 and/or 365 to 99688.0 filed in Great Britain on Jul. 16, 1999; the entire content of which is hereby incorporated by reference.

TECHNICAL FIELD

This invention relates to integrated circuits, and in particular to integrated analog filter circuits.

BACKGROUND OF THE INVENTION

In integrated circuits, it is extremely difficult to realise inductors, except with very low inductances. As a result, it is generally only possible to use RC filters (with resistors and capacitors), except at very high frequencies.

As an alternative, active filters are often used. Such devices use transconductance elements such as transistors, in combination with capacitors, which together can form integrators or gyrators, and can emulate the impedance of inductors.

An integrated gyrator structure, for use in a very high frequency filter, is proposed in Nauta "A CMOS Transconductance-C Filter Technique for Very High Frequencies", IEEE Journal of Solid State Circuits, Vol. 27, No. 2, February 1992. The author's first order analysis of the circuit concluded that the proposed gyrator behaves stably.

The author also proposed a Q-tuning loop, to provide a controllable Q-value for the filter at very high frequencies.

SUMMARY OF THE INVENTION

The present invention proceeds from the realization that this first order analysis of the prior art structure results in an incomplete understanding of the structure.

In particular, a more detailed analysis of the MOS transistors reveals that each MOS transistor adds a delay element due to the actions of charged particles in the channel of the transistor. More specifically, the nonquasi-static behaviour of the channel charge adds a delay, which could be approximated as a parasitic pole, in the frequency characteristic of the transconductance of the device. The channel delays of the transistors can make the gyrator unstable, in particular in the case of higher order filters (which are often required, in order to provide the necessary filter characteristics), or at higher frequencies (when the channel delay becomes more of a problem).

Moreover, the channel delay means that the prior art Q-tuning loop does not function as intended.

The present invention attempts to overcome the disadvantages of the prior art, by taking the channel delay of the transistors into consideration.

Specifically, the invention relates in one aspect to the design of an integrated circuit device, in a way which includes consideration of the channel delay of the transistors.

In another aspect, the invention relates to an integrated circuit device, in which the channel delay of a transistor is compensated by means of series feedback.

In another aspect, the invention relates to the design method, which accounts for the channel delay.

DETAILED DESCRIPTION OF PREFERRED EMBODIMENTS

Figure 1:
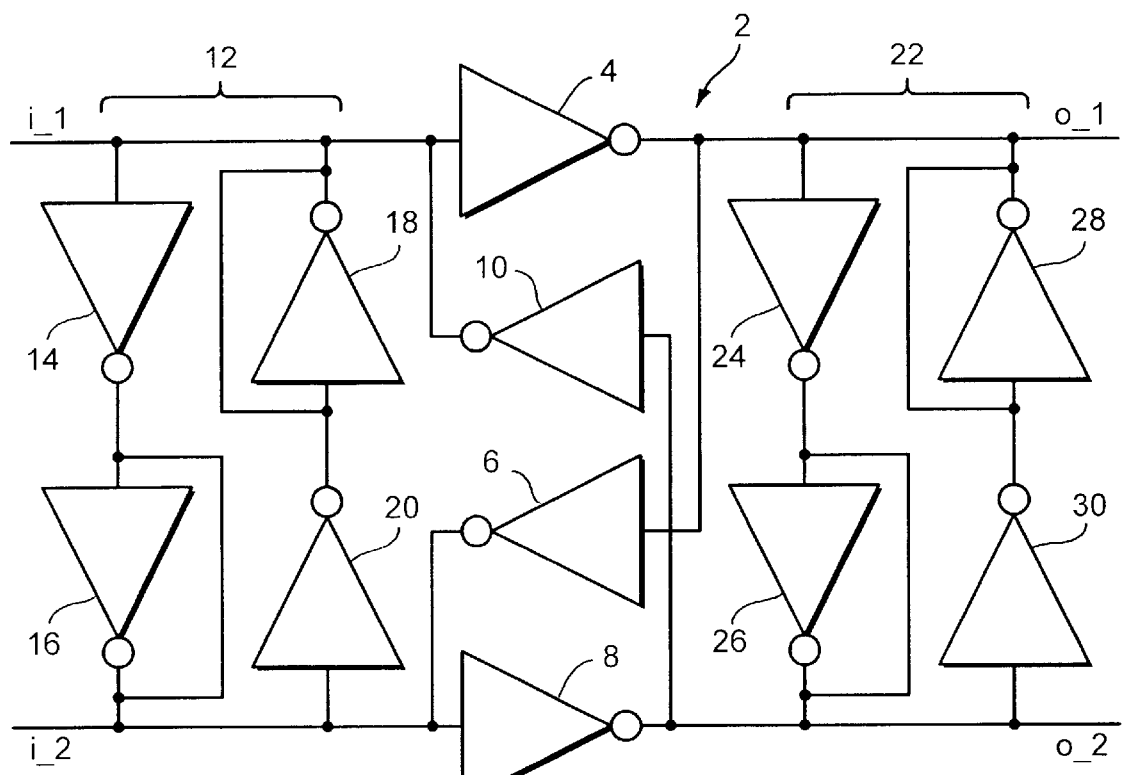
FIG. 1 is a block schematic diagram of a gyrator circuit in accordance with the invention.

FIG. 1 shows a gyrator cell 2. The core of the gyrator cell comprises four CMOS inverter circuits 4, 6, 8, 10, which are arranged in a loop, with the output of each inverter being connected to the input of the next. The gyrator has first and second differential inputs i_1, i_2, and first and second differential outputs o_1, o_2. The cell also includes an input common mode feedback network 12, comprising inverters 14, 16, 18, 20, and an output common mode feedback network 22, comprising inverters 24, 26, 28, 30.

In general, a gyrator consists of a positive transconductance and a negative transconductance. In the cell of FIG. 1, the negative transconductance is formed by using differential signals and crossing one pair of wires. It is this crossing of the wires to form a cross-coupled structure which results in stability problems. Thus, the present invention applies to any cross-coupled structure.

The analysis herein is set out in the context of a gyrator, and hence relates specifically to filters formed from gyrators. However, the same analysis applies also to integrators, and hence also to filters formed from integrators. Thus, the present invention encompasses such devices.

Figure 2:
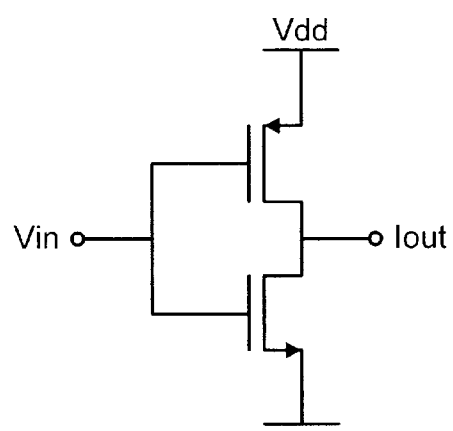
FIG. 2 is a circuit diagram of an inverter in the circuit of FIG. 1.

In devices according to the present invention, conventional CMOS inverters, as shown in FIG. 2, may conveniently be used, and the subsequent description relates primarily to such devices. However, the analysis applies also to bipolar and BiCMOS devices, and hence also to filters formed from such devices. Thus, the present invention encompasses such devices also.

The present invention proceeds from the realization that the conventional first order analysis of the properties of the devices, for example, in the case of a MOS transistor, assuming that the MOS transadmittance is purely conductive, is inadequate. An alternative analysis, considering a nonquasi-static channel delay, is therefore proposed.

Thus, the MOS transadmittance, modelling the channel delay, can be approximated as:

$$y_m = g_m e^{s \cdot \tau_{gm}} \approx \frac{g_m}{1+s \cdot \tau_{gm}} \approx g_m - s \cdot c_m$$

where conventional notation has been used, that is, $g_m$ is the device transconductance, $C_{gs}$ is the device gate-source capacitance, $\tau_{gm}=2/(\epsilon \omega_T)$, $C_m=2C_{gs}/\epsilon$, where $\omega_T$ is the transit angular frequency, that is, the angular frequency when the current gain is one, and $\epsilon$, the Elmore constant of the channel$\mp$5.

Thus, this analysis gives different possible approximations for the effect of the channel delay. A first possibility is to assume a pure delay, using the exponential function. However, the resulting function is difficult to use in analyses. A second possibility is to use the final approximation, which gives a zero in the right-hand half of the complex plane. A third possibility is to use the intermediate approximation, which gives a pole. The second and third possible models give the same phase lag, providing the pole and zero time constants are equal, so this aspect of the stability analysis is satisfactory. The zero in the right-hand half of the complex plane gives the amplitude of the transadmittance a high-pass characteristic, while the intermediate approximation, with the pole, gives the amplitude of the transadmittance a low-pass characteristic. The latter is more realistic, and so that is the model used hereinafter.

Figure 3:
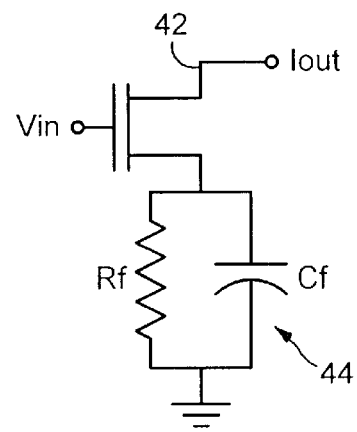
FIG. 3 is a circuit diagram showing a transistor, with a feedback circuit, which can be used in the circuit of FIG. 1.

In one advantageous embodiment of the invention, each MOS transistor in the gyrator core has series feedback added thereto. FIG. 3 shows a transistor 42 and feedback circuit 44. Specifically, the feedback circuit 44 comprises the parallel combination of a feedback resistor Rf (having resistance $r_f$) and capacitor Cf (having capacitance $c_f$), connected to the source terminal of the transistor and in series with it. Defining the impedance of the feedback circuit as $r_f \| c_f = z_f = r_f/(1+s \cdot \tau_f)$, the closed loop transfer-admittance $G_T$ is:

$$G_T = \frac{y_m}{1+y_m \cdot z_f} = \frac{\frac{g_m}{1+s \cdot \tau_{gm}}}{1+\frac{g_m}{1+s \cdot \tau_{gm}} \cdot \frac{r_f}{1+s \cdot \tau_f}} =$$

$$\frac{g_m}{1+g_m \cdot r_f} \cdot \frac{1+s \cdot \tau_f}{1+s \cdot \frac{\tau_{gm}+\tau_f}{1+g_m \cdot r_f} + s^2 \frac{\tau_{gm} \cdot \tau_f}{1+g_m \cdot r_f}}$$

In the limit, when $g_m \cdot r_f \gg 1$, $G_T$ will approximate $1/z_f$ at low frequencies. Thus, $G_T$ will have a left half-plane zero, resulting in an initial phase advance. Since, without feedback, there is a phase lag, this suggests that a balance condition can be found, in which, at least below a particular frequency, the phase-lag can be minimized.

Thus, by choosing an appropriate approximation for the channel delay, it is possible to compensate therefor over a large bandwidth. The resulting design can then be used as the basis for an integrated circuit device.

Figure 4:
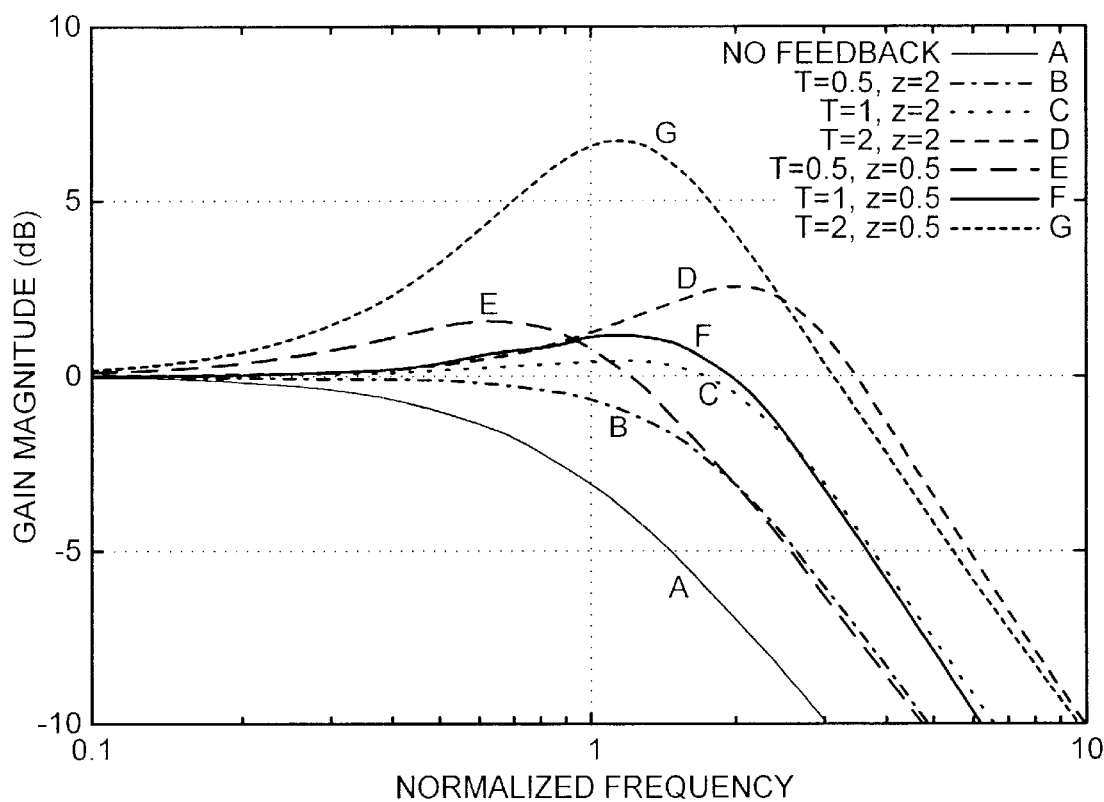
FIG. 4 is a plot of transfer-admittance magnitude against frequency for devices according to the invention.
Figure 5:
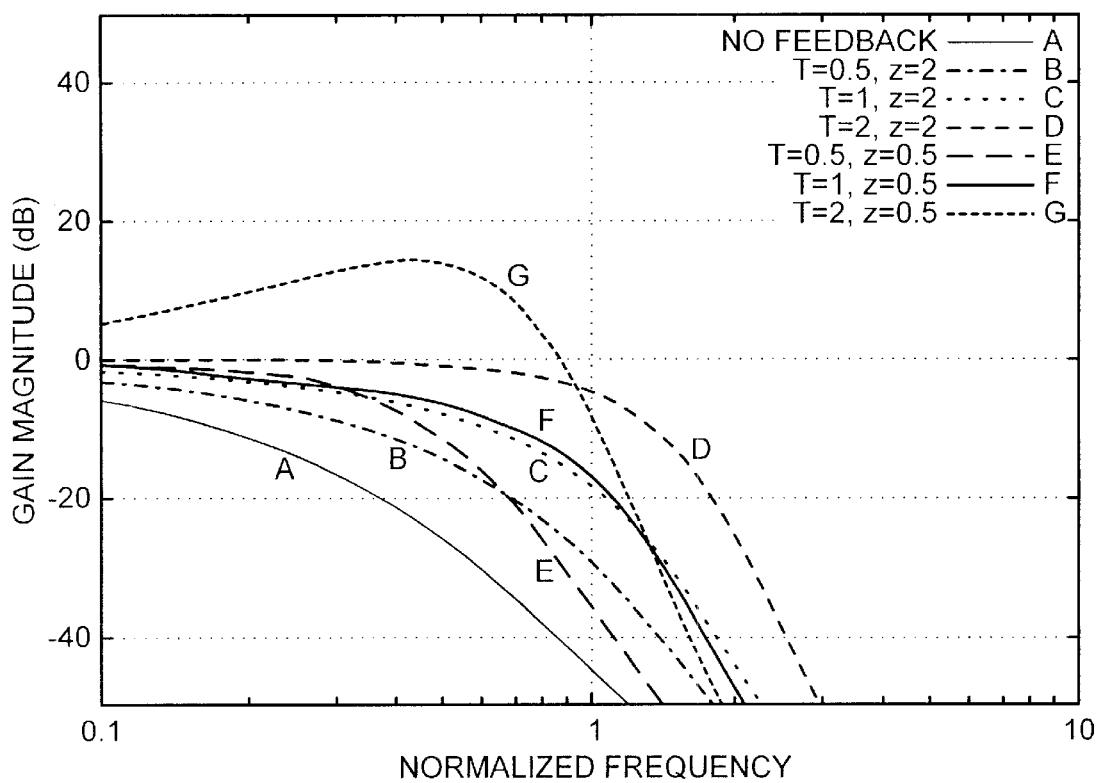
FIG. 5 is a plot of transfer-admittance phase against frequency for devices according to the invention.

FIGS. 4 and 5 show various plots A–G of the magnitude and phase respectively of the transfer-admittance, for different values of the parameters T and z, where $T=g_m \cdot r_f$ and $\tau_f=1/z$, and where $\tau_{gm}=1$. It can thus be seen that a moderate loop gain can result in a substantial widening of the transadmittance bandwidth, and can also provide some phase lead, which may be desirable to compensate for some other parasitic-induced phase lag.

Figure 6:
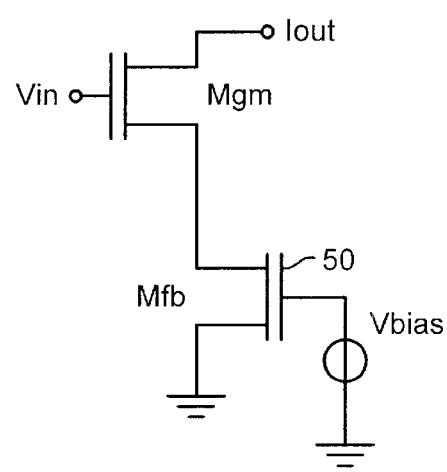
FIG. 6 is a circuit diagram showing a transistor, with a feedback circuit, which can be used in the circuit of FIG. 1.

In a practical application of the invention, it is important that the characteristic parameters (such as $g_m$, $r_f$, $\tau_{gm}$ and $\tau_f$) should have a constant relationship in all production devices at different operating temperatures and supply voltages. FIG. 6 shows a way of achieving this in an IC. Specifically, an MOS transistor 50, operating in its triode region, is used as the feedback impedance. In this case, $r_f=1/g_d$ and $c_f=c_{gd}$. Advantageously, the bias voltage connected to the gate of the transistor 50 tracks variations in the supply voltage to the gyrator cell. In the case of the gyrator structure proposed by Nauta in "A CMOS Transconductance-C Filter Technique for Very High Frequencies", IEEE Journal of Solid State Circuits, Vol. 27, No. 2, February 1992, for example, the supply voltage to the gyrator cell is derived from a tuning circuit, which provides a voltage which is dependent on variations in process, temperature and supply voltage. Thus, if the bias voltage tracks variations in the gyrator cell tuning voltage, this can ensure that $r_f \, 1/g_m$ and $\tau_f \tau_{gm}$ over normal variations in process, temperature and supply.

There is thus provided a circuit which can compensate for channel delay in a gyrator or other cross-coupled structure.

There is further provided a method of designing an integrated circuit to achieve such compensation.

What is claimed is:

1. An integrated circuit gyrator comprising:

first and second input terminals and first and second output terminals; and first, second, third and fourth MOS inverters arranged in a loop, wherein an output of said first MOS inverter is connected to said first output terminal and an input of said third MOS inverter, wherein an output of said second MOS inverter is connected to said first input terminal and an input of said first MOS inverter, wherein an output of said third MOS inverter is connected to said second input terminal and an input of said fourth MOS inverter, wherein an output of said fourth MOS inverter is connected to said second output terminal and an input of said second MOS inverter, and wherein series feedback is associated with each of the MOS transistors therein.

2. An integrated circuit gyrator as claimed in claim 1, wherein the series feedback is provided by a parallel combination of a resistor and a capacitor, connected in series with the respective transistor.

3. An integrated circuit gyrator as claimed in claim 2, wherein each parallel combination of a resistor and a capacitor is connected to the source terminal of the respective transistor.

4. An integrated circuit gyrator as claimed in claim 1, having a cross-coupled structure.

5. An integrated circuit gyrator as claimed in claim 1, wherein the series feedback is provided by a further MOS transistor connected to the respective device, each further MOS transistor having a bias voltage applied thereto such that it operates in its triode region.

6. An integrated circuit gyrator as claimed in claim 5, wherein the bias voltage tracks variations in a tuning voltage supplied to the gyrator, in order to compensate for variations in process, temperature and supply.

7. A method of designing a integrated circuit analog filter, the filter comprising at least one cross-coupled structure containing four MOS transistors, the method comprising:

providing the filter with first and second input terminals and first and second output terminals;

arranging the four MOS transistors in a loop, wherein an output of a first MOS transistor is connected to said first output terminal and an input of a third MOS transistor, wherein an output of a second MOS transistor is connected to said first input terminal and an input of said first MOS transistor, wherein an output of said third MOS transistor is connected to said second input terminal and an input of a fourth MOS transistor, wherein an output of said fourth MOS transistor is connected to said second output terminal and an input of said second MOS transistor;

accounting for the channel delay of at least some of said MOS transistors; and adding series feedback associated with said MOS transistors to compensate therefor over a large bandwidth.

8. A method as claimed in claim 7, further comprising realising an integrated circuit structure in accordance with said method.

* * * * *